SEMICONDUCTOR DIODE WITH INTEGRATED MOUNTING AND SMALL AREA FUSED IMPURITY JUNCTION

Filed March 16, 1962 2 Sheets-Sheet 1

INVENTORS:
NORBERT ADAMS,
TAPAN MUKERJEE,
JAMES M. SMITH,

BY Julius J. Zaskalicky
THEIR ATTORNEY.

Jan. 10, 1967 N. ADAMS ETAL 3,297,920

SEMICONDUCTOR DIODE WITH INTEGRATED MOUNTING AND SMALL AREA FUSED IMPURITY JUNCTION

Filed March 16, 1962 2 Sheets-Sheet 2

INVENTORS:
NORBERT ADAMS,
TAPAN MUKERJEE,
JAMES M. SMITH,

BY Julius J. Zaskalicky
THEIR ATTORNEY.

3,297,920

SEMICONDUCTOR DIODE WITH INTEGRATED MOUNTING AND SMALL AREA FUSED IMPURITY JUNCTION

Norbert Adams, Syracuse, Tapan Mukerjee, North Syracuse, and James M. Smith, Liverpool, N.Y., assignors to General Electric Company, a corporation of New York Filed Mar. 16, 1962, Ser. No. 180,164
5 Claims. (Cl. 317—234)

The present invention relates generally to semiconductor devices, and particularly to diode devices and methods for fabricating such devices.

The present invention has particular application to diodes made by an alloy process, such as tunnel diodes, backward diodes, zener diodes, varactors and the like. A tunnel diode which is typical of such devices conventionally comprises a body of very low resistivity semiconductor material of one conductive type into which is alloyed a quantity of suitable activator material to form therein a region of very low resistivity of the opposite conductivity type. The body is usually conductively mounted on a platform and leads connected to the body and alloy material. Usually the junction between the body of one conductivity type and the region of one conductivity is quite small, and accordingly, presents a problem in mechanical support. The prior art structures generally described above leave something to be desired with regard to ruggedness, reliability, ease and cost of fabrication, as well as electrical performance. The present invention is directed to overcoming the shortcomings in such prior art devices and their methods of fabrication.

An object of the present invention is to provide diode devices which are simple in construction and inexpensive to make, yet which are superior over prior art devices in ruggedness, reliability and electrical performance.

Another object of the present invention is to provide a simple, effective and low cost method for forming diodes having very small area junctions, yet which are mechanically strong.

Still another object of the present invention is to provide diodes which do not require separate headers or housings.

A further object of the present invention is to provide diodes having such highly advantageous electrical characteristics as very low inductance and capacitance, making them suitable for a wide variety of low and high frequency applications.

The present invention is carried out in one illustrative form thereof in a tunnel diode comprising a planar insulating member having a pair of opposed sides, a pair of planar semiconductor pellets of one and the opposite conductivity type, one of said pellets having one face thereof securely bonded to one side of said member and the other of said pellets having one face thereof securely bonded to the other side of said member and a quantity of activator material of one conductivity-inducing type fused to said member and said wafers.

The features of the invention which are believed to be novel are set forth with particularity in the appended claims. The invention itself, however, both as to its organization and method of operation, together with further objects and advantages thereof, may best be understood by reference to the following description taken in accordance with the accompanying drawings, in which:

Figure 1:
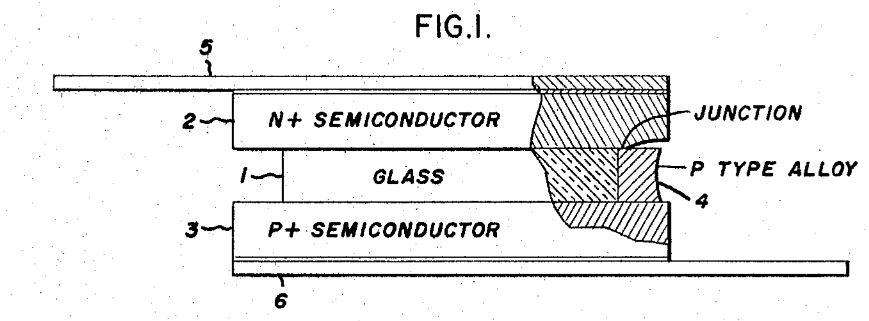
FIGURE 1 shows a sectional view of one of the devices in accordance with the present invention.
Figure 2:
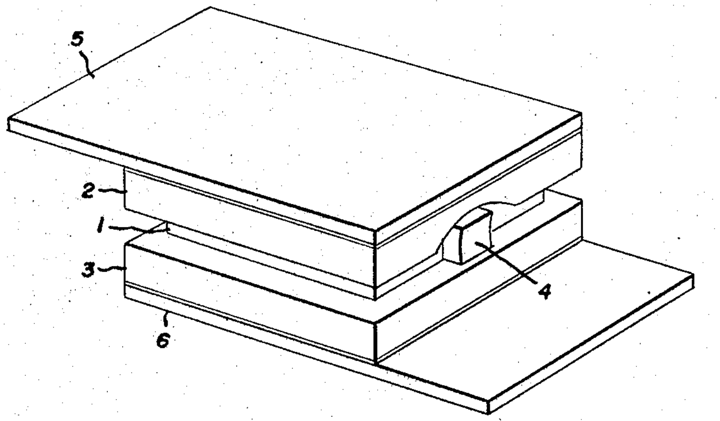
FIGURE 2 shows a perspective view of the device of FIGURE 1.

Referring now to FIGURES 1 and 2, there is shown a tunnel diode device comprising a planar insulating member 1, a pair of planar pellets 2 and 3 having edges overlapping the edge of the insulating member, and a quantity 4 of activator material. The insulating member 1 is illustratively shown as sheet glass. The planar pellet 2 is illustratively shown as heavily doped N-type conductivity germanium semiconductor material having a face securely bonded to one side of the insulating member 1. The planar pellet 3 is illustratively shown as heavily doped P-type conductivity germanium semiconductor material having a face securely bonded to the other side of the insulating member 1. The quantity 4 of activator material, illustratively shown as inducing P-type conductivity, for example, an alloy of indium and gallium (99% indium, 1% gallium), is fused to the pellets 2 and 3 and the insulating member 1 to form a tunnel junction with N-type pellet 2 and ohmic contact with P-type pellet 3. A portion of the pellet 2 is etched away to reduce it to the size of the junction to correct proportions, as desired. A conductive lead 5 is soldered to one of the pellets and another conductive lead 6 is soldered to the other of the pellets.

The individual planar sandwich structures for formation of individual devices are obtained from a large laminated structure or sandwich of these materials. One laminate may consist of a wafer of very heavily doped N-type germanium. Another laminate consists of a wafer of very heavily doped P-type germanium. The wafers are lapped and polished or etched to control thickness, for example, seven mils thickness (one mil is one-thousandths of an inch). Sheet glass is preferred as the planar insulating member because it has superior wetting properties and its composition and thickness can be controlled. With laminar glass, layers can be held to a thickness of three mils with a tolerance of $\pm 0.5$ mil. The glass is selected to have a thermal coefficient of expansion close to that of semiconductors so as to minimize cracking in structure. The laminated structure is formed by the assembling of the sheet glass laminate between the semiconductor wafers or laminates and heating to a specified temperature for a specified time, for example, 900° C. for 20 minutes, to cause the glass to melt and fuse to the wafers. The melting temperature of the glass should be less than the melting temperature of the germanium wafers. The glass should be selected to have a working temperature between 50° and 100° C. below the melting temperature of the semiconductor elements. Also, in order to minimize capacitance effects, the dielectric constant and the conductivity of the glass should be selected as low as possible consistent with the requirements of wetting, thermal expansion and low working temperatures. Borosilicate 7056 glass, a glass made and sold commercially by the Corning Glass Works of Corning, New York, under the aforementioned name, Borosilicate 7056 glass, has been found to meet all these requirements satisfactorily. Further information on this glass is included in their brochure B–3 entitled, "Properties of Selected Commercial Glasses," copyrighted 1961. It will be understood that any material that meets these requirements would be suitable.

As described above, the wafer sandwiches are then either sawed or scribed and broken or etched to ultimate individual device sandwiches. A useful size has been found to be 20 x 20 x 15 mils. With a one-inch diameter wafer, about 500 to 1000 units can be formed simultaneously in the dicing operation described. The notches formed in the glass sandwich as shown in FIGURE 1 are formed by undercutting or etching the glass, leaving the semiconductor wafer overlapping the glass. For example, hydrofluoric acid will batch etch Corning Borosilicate 7056 glass selectively from N+ or P+ germanium sandwiches without significantly affecting the germanium. One advantage of notching lies in the exposure of predetermined orientation planes (such as <111> or <100> planes of semiconductor wafers so cut) for subsequent good alloy junction formation.

To assemble the device of FIGURES 1 and 2, an individual planar sandwich as formed above is placed over a suitable solder preform, for example, in connection with P-type material, a gold-germanium (by weight 88% gold, 12% germanium) or gold-gallium eutectic preform would be suitable, and a lead, for example, of gold-plated Fernico or Kovar (Fernico and Kovar are well-known alloys consisting of iron, nickel and cobalt and having a linear coefficient of expansion similar to that of glass). On top of the sandwich is placed another preform, for example, of gold-antimony (by weight 95% gold, 5% antimony) or gold-germanium (by weight 88% gold, 12% germanium) material for N-type material, and another gold-plated Fernico or Kovar lead. A quantity of activator material commonly referred to as an alloy-dot is placed in the notch or recess between the N-type pellet and the P-type pellet, engaging all elements of the sandwich. For the structure shown, an indium-gallium alloy as mentioned above was used.

The assembly of elements are then heated to 500–600° C. for a suitable time, for example, ten seconds, to cause a simultaneous alloying of the dot to the semiconductor materials and the glass plate and to cause the leads to be securely bonded to the semiconductor materials. With an indium-gallium dot, a tunnel junction is made with the N-type pellet and an ohmic contact is made with a P-type pellet. The tunnel junction is then electrolytically or chemically etched in an appropriate electrolyte such as a sodium hydroxide solution to reduce the junction area to sufficient size to produce the characteristics desired in a manner well known in the art. The sandwich may then be potted, if desired, for additional mechanical strength and protection or otherwise hermetically sealed.

It will be appreciated that while specific materials were mentioned in connection with the device of FIGURES 1 and 2, these were mentioned in an exemplary sense. Other semiconductor materials, for example, silicon and various compound semiconductors such as gallium arsenide, could be used. Other insulating materials, for example, various insulating oxides such as semi-insulating zinc oxide, could be used. A variety of alloy-dot materials could be used, for example, silver-gallium (by weight 93% silver, 7% gallium) or tin-lead-gallium (by weight 49.5% tin, 49.5% lead, 1% gallium). Should it be desired to make a tunnel junction with the P+ wafer, an alloy such as tin-arsenic (by weight 99% tin, 1% arsenic) or lead-arsenic (by weight 99% lead, 1% arsenic) would have been suitable. Also, if desired, the glass plate could have remained unetched and the alloy contact made to the edge of the sandwich.

Figure 3:
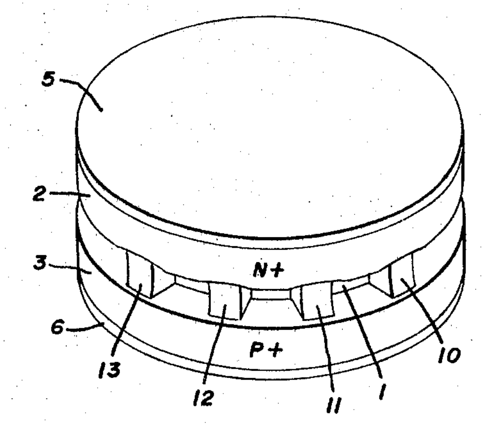
FIGURE 3 shows a perspective view of another embodiment of the present invention in which a plurality of diodes are incorporated in one planar sandwich structure.
Figure 4:
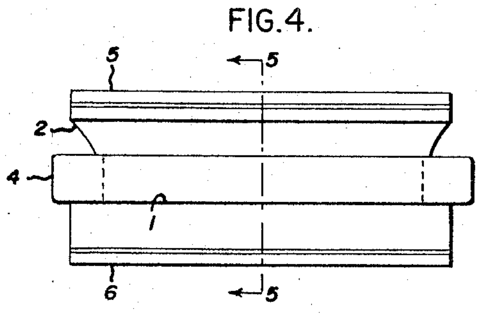
FIGURE 4 shows a side view of another embodiment of the present invention in which a continuous strip of alloy material is fused in the recess thereof to provide an annular junction.
Figure 5:
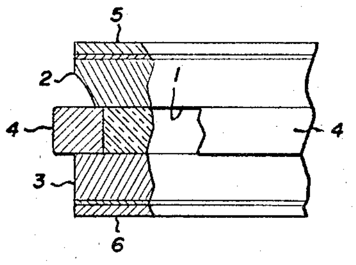
FIGURE 5 shows a sectional view of the device of FIGURE 4 taken along section 5—5.

Referring now to FIGURE 3, there is shown a perspective view of a semiconductor device in which a plurality of diodes are arrayed around the periphery of the laminated structure. The parts of the device of FIGURE 3 corresponding to the parts of the device of FIGURE 1 are indicated by the same reference numerals applied in FIGURES 1 and 2. The materials and the methods of fabrication of such a device are essentially identical to the materials and methods of fabricating the device of FIGURES 1 and 2, with the exception of the plurality of alloy dots indicated as 10, 11, 12 and 13. The device of FIGURE 3 is suitable for applications where high current carrying requirements exist. The device of FIGURE 3 has low series resistance and low thermal resistance as well.

Where distributed parameters are desired in the device, a structure such as shown in FIGURES 4 and 5 can be used. The device of these figures is similar to the device of FIGURE 3 except that the activator material is continuously distributed around the periphery of the structure. The materials and the methods of fabrication of such a device are essentially identical to the material and methods of fabrication of the device of FIGURES 1 and 2. Corresponding parts of the device of FIGURES 4 and 5 are indicated by the same reference numerals.

Figure 6:
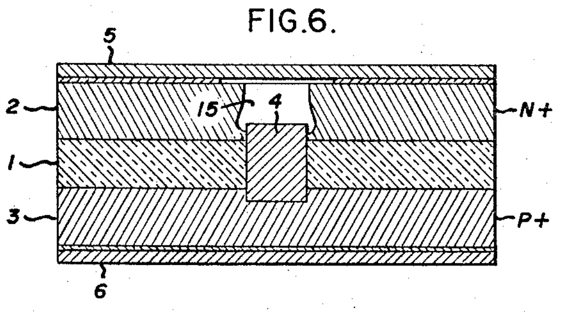
FIGURE 6 shows another embodiment of the present invention with provision for hermetically sealing the active portions of the device.

In FIGURE 6 is shown another embodiment of the invention in which the P–N junction of the device is hermetically sealed. This device is fabricated essentially of the same materials and in the same way as the device of FIGURES 1 and 2, and corresponding parts are designated by the same reference numerals. However, to locate alloy activator material 4 to permit hermetic sealing, modification of the process is necessary. After assembling the sandwich structure as in the device of FIGURES 1 and 2, a hole 15 is drilled, for example, by ultrasonically cutting, through one of the semiconductor pellets 2 through the glass insulating member 1 to the other semiconductor pellet 3. A mass of activator material 4 of appropriate conductivity type is inserted into the bore and fused to the planar glass member and to the semiconductor wafers. The device is then etched in the same way as the device of FIGURE 1 and subsequently conductive plates 5 and 6 are secured to the N+ and P+ wafers to provide contacts to these layers and at the same time to hermetically seal in the P–N junction of the device.

Figure 7:
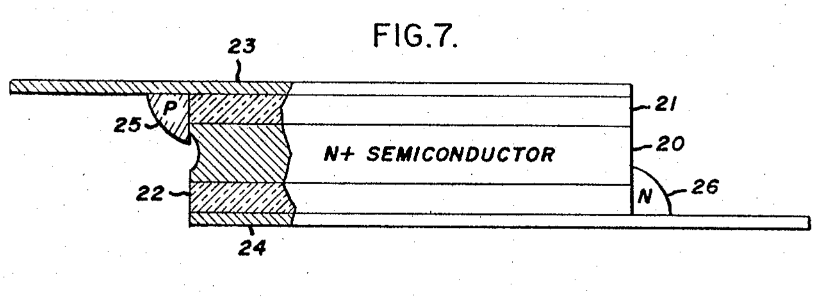
FIGURE 7 shows another embodiment of the present invention in which a single planar pellet of semiconductor material is utilized and a pair of insulating support members are bonded thereto.

In FIGURE 7 is shown another embodiment of the present invention in which a single semiconductor planar pellet 20 is sandwiched between a pair of planar insulating members 21 and 22, illustratively shown as a glass plate. The individual planar sandwich of the device is fabricated in essentially the same way as the planar sandwich of the device of FIGURE 1 and 2. The glass may be etched or not, to provide a recess or notch therein as desired. A lead 23 is placed in contact with member 21 and another lead 24 is placed in contact with member 22. A quantity of activator material 25, shown as inducing P-type conductivity, is placed in contact with the edges of members 20 and 21 and with lead 23. Another quantity of activator material 26, shown as inducing N-type conductivity, is placed in contact with the edges of members 20 and 22 and with lead 24. The leads 23 and 24 are fused to members 21 and 22 and the activator materials 25 and 26 in one fusing operation similarly as the device of FIGURES 1 and 2. The device is etched to desired characteristics as with the device of FIGURES 1 and 2.

Figure 8:
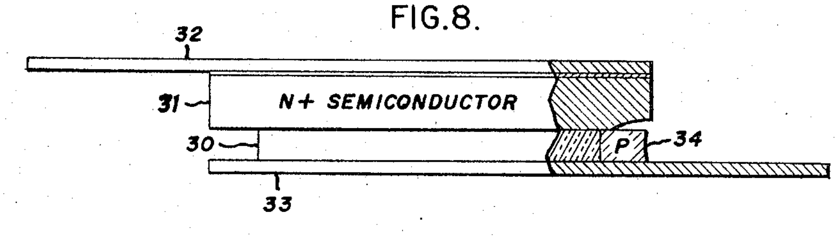
FIGURE 8 shows a further embodiment of the present invention in which the sandwich structure consists of a planar pellet and a planar insulating member.

FIGURE 8 shows another embodiment of the present invention making use of a two-layer sandwich structure consisting of an insulating member 30 and a planar pellet 31 of semiconductor material of N-type conductivity. The individual sandwich structure may be formed in the same way as the structure of FIGURE 1 is formed. The leads 32 and 33 and a quantity 34 of activator material of P-type conductivity are then put in position and fused in one fusing operation to form the junction and to provide electrical contacts bonded to the glass and the semiconductor. The junction of the device is then etched to size as desired.

Devices made in accordance with the present invention are not only extremely rugged but are simple in construction, and are easily and inexpensively made. In addition, the devices provided have lower inductances and capacitances, and lower series resistances and thermal resistances than conventional devices, making them suitable for a wide variety of low and high frequency applications.

While specific embodiments have been shown and described, it will, of course, be understood that various modifications may yet be devised by those skilled in the art which will embody the principles of the invention and be found in the true spirit and scope thereof.

What we claim as new and desire to secure by Letters Patent of the United States is:

1. A semiconductor device comprising a planar insulating member having a pair of opposed sides, a pair of planar semiconductor pellets of one and the opposite conductivity type, one of said pellets of one conductivity type having one face thereof securely bonded to one side of said member, the other of said pellets of opposite conductivity type having the other face thereof securely bonded to the other side of said member, an alloy dot of activator material of opposite conductivty inducing type fused to a coplanar edge of said member and said pellets, the contact of said activator material to said one pellet forming a small area PN junction, and means for making electrical connection to the other sides of said pellets.

2. A semiconductor device comprising a planar insulating member having a pair of opposed sides, a pair of planar semiconductor pellets of one and the opposite conductivity type, one of said pellets of one conductivity type having one face thereof securely bonded to one side of said member and extending beyond the periphery of said member, the other of said pellets of opposite conductivity type having the other face thereof securely bonded to the other side of said member and extending beyond the periphery of said member, a quantity of activator material of opposite conductivity inducing type fused to the edge of said member and to adjacent faces of said pellets within the recess formed by the peripherally extending portions of said pellets, the area of contact of said activator material to said one pellet being reduced by a groove formed between said one pellet and a portion of the adjacent surface of said activator material so as to form a small area PN junction between the activator material and said one pellet, and means for making electrical connection to the other sides of said pellets.

3. A semiconductor device comprising a planar insulating member having a pair of opposed sides, a pair of planar semiconductor pellets of one and the opposite conductivity type, one of said pellets of one conductivity type having one face thereof securely bonded to one side of said member, the other of said pellets of opposite conductivity type having the other face thereof securely bonded to the other side of said member, an alloy dot of activator material of opposite conductivity inducing type fused to the edge of said member and said pellets, the contact of said activator material to said one pellet forming a small area PN junction, a conductor secured to one of said pellets, and another conductor secured to the other of said pellets.

4. A semiconductor device comprising a planar insulating member having a pair of opposed sides, a pair of planar semiconductor pellets of one and the opposite conductivity type, one of said pellets of one conductivity type having one face thereof securely bonded to one side of said member and extending beyond the periphery of said member, the other of said pellets of opposite conductivity type having the other face thereof securely bonded to the other side of said member and extending beyond the periphery of said member, a plurality of discrete masses of activator material of opposite conductivity inducing type fused to the edge of said member and to adjacent faces of said pellets, the area of contact of each of said discrete masses of activator material to said one pellet being much smaller than the area of contact of said one pellet to said insulating member, and means for making electrical connection to the other sides of said pellets.

5. A semiconductor device comprising a planar insulating member having a pair of opposed sides, a pair of planar semiconductor pellets of one and the opposite conductivity type, one of said pellets of one conductivity type having one face thereof securely bonded to one side of said member and extending beyond the periphery of said member, the other of said pellets of opposite conductivity type having the other face thereof securely bonded to the other side of said member and extending beyond the periphery of said member, a mass of activator material of opposite conductivity inducing type extending about the edge of said member and fused thereto and to adjacent faces of said pellets within the recess formed by the peripherally extending portions of said pellets, the area of contact of said activator material to said one pellet being reduced by a groove formed between said one pellet and a portion of the adjacent surface of said activator material so as to form a small area PN junction between the activator material and said one pellet, and means for making electrical connection to the other sides of said pellets.

References Cited by the Examiner

UNITED STATES PATENTS

| | | | |
|---|---|---|---|
| 1,745,175 | 1/1930 | Lilienfeld | 317—235 X |
| 2,681,993 | 6/1954 | Shockley | 317—235 X |
| 2,975,344 | 3/1961 | Wegener | 148—33.5 |
| 3,121,828 | 2/1964 | Im | 317—234 |
| 3,133,336 | 5/1964 | Marinace | 317—235 |

JOHN W. HUCKERT, *Primary Examiner.*

J. D. KALLAM, A. S. KATZ, J. D. CRAIG, *Assistant Examiners.*